(12) United States Patent
Nasu

(10) Patent No.: US 12,407,090 B2
(45) Date of Patent: Sep. 2, 2025

(54) ANTENNA DEVICE AND COMMUNICATION TERMINAL DEVICE

(71) Applicant: Murata Manufacturing Co., Ltd., Nagaokakyo (JP)

(72) Inventor: Takafumi Nasu, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 94 days.

(21) Appl. No.: 18/418,455

(22) Filed: Jan. 22, 2024

(65) Prior Publication Data

US 2024/0162611 A1 May 16, 2024

Related U.S. Application Data

(63) Continuation of application No. PCT/JP2022/028381, filed on Jul. 21, 2022.

(30) Foreign Application Priority Data

Sep. 3, 2021 (JP) ................................ 2021-144106
Oct. 22, 2021 (JP) ................................ 2021-173126

(51) Int. Cl.
*H01Q 1/24* (2006.01)
*H01Q 5/378* (2015.01)

(52) U.S. Cl.
CPC .............. *H01Q 1/243* (2013.01); *H01Q 5/378* (2015.01)

(58) Field of Classification Search
CPC .. H01Q 1/243; H01Q 5/30; H01Q 5/307–392; H01Q 5/378; H01Q 5/50; H03H 7/38
See application file for complete search history.

(56) References Cited

U.S. PATENT DOCUMENTS

| | | |
|---|---|---|
| 2014/0055209 A1 | 2/2014 | Ishizuka et al. |
| 2019/0214727 A1 | 7/2019 | Mikawa et al. |
| 2020/0373083 A1 | 11/2020 | Nasu |

FOREIGN PATENT DOCUMENTS

| | | |
|---|---|---|
| JP | 2014053808 A | 3/2014 |
| WO | 2012153654 A1 | 11/2012 |
| WO | 2018101284 A1 | 6/2018 |
| WO | 2019208297 A1 | 10/2019 |
| WO | 2020219160 A1 | 10/2020 |

OTHER PUBLICATIONS

International Search Report in PCT/JP2022/028381, mailed Oct. 11, 2022, 3 pages.
Written Opinion in PCT/JP2022/028381, mailed Oct. 11, 2022, 3 pages.

*Primary Examiner* — Robert Karacsony
(74) *Attorney, Agent, or Firm* — Keating & Bennett, LLP

(57) ABSTRACT

An antenna device includes first and second antennas. The first antenna includes a first radiating element connected to a feed circuit to supply a radio-frequency signal, and a first coil connected between the first radiating element and the feed circuit. The second antenna includes a second coil magnetically coupled to the first coil, and a second radiating element connected to the second coil. An impedance of the first antenna is higher than about 50Ω at a resonant frequency of a fundamental of the second antenna.

20 Claims, 13 Drawing Sheets

ANTENNA DEVICE AND COMMUNICATION TERMINAL DEVICE

CROSS REFERENCE TO RELATED APPLICATIONS

This application claims the benefit of priority to Japanese Patent Application No. 2021-144106 filed on Sep. 3, 2021 and Japanese Patent Application No. 2021-173126 filed on Oct. 22, 2021, and is a Continuation Application of PCT Application No. PCT/JP2022/028381 filed on Jul. 21, 2022. The entire contents of each application are hereby incorporated herein by reference.

BACKGROUND OF THE INVENTION

1. Field of the Invention

The present disclosure relates to antenna devices and communication terminal devices.

2. Description of the Related Art

In recent years, communication terminal devices have been developed that are caused to operate in a plurality of frequency bands. An antenna device used in such communication terminal devices includes two antennas that are coupled directly or indirectly to each other because the bandwidth of an available frequency band has to be broadened. International Publication No. WO 2019/208297, discloses an antenna device in which two antennas, which are a feed antenna that is supplied with power and a parasitic antenna that is not supplied with power, are coupled.

In the antenna device disclosed in International Publication No. WO 2019/208297, in a case of the use, for example, in Low-Band (about 0.7 GHz to about 0.96 GHz) used in LTE (Long Term Evolution), a resonant frequency is not very high, and thus a sufficient antenna length (length of a radiating element) can be provided.

However, the antenna length is reduced as the resonant frequency increases. For this reason, in a case of the use, for example, in a frequency band (about 3.3 GHz to about 5.0 GHz) used in the fifth generation mobile communication system (5G), in the antenna device, the length of a parasitic antenna that is not supplied with power is reduced, and sufficient radiation efficiency is not achieved in some cases.

SUMMARY OF THE INVENTION

Example embodiments of the present invention provide antenna devices in each of which the bandwidth of a frequency band that is used is broadened and sufficient radiation efficiency is achieved, and communication terminal devices.

An antenna device according to an example embodiment of the present invention includes a first antenna and a second antenna. The first antenna includes a first radiating element connected to a feed circuit that supplies a radio-frequency signal, and a first coil connected between the first radiating element and the feed circuit. The second antenna includes a second coil magnetically coupled to the first coil, and a second radiating element connected to the second coil. An impedance of the first antenna is higher than about 50Ω at a resonant frequency of a fundamental of the second antenna.

A communication terminal device according to an example embodiment of the present invention includes a feed circuit and an antenna device according to an example embodiment of the present invention.

In the antenna devices according to example embodiments of the present invention, since an impedance of a first antenna is higher than about 50Ω at a resonant frequency of a fundamental of the second antenna, a bandwidth of a frequency band that is used is able to be broadened, and sufficient radiation efficiency is able to be achieved.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
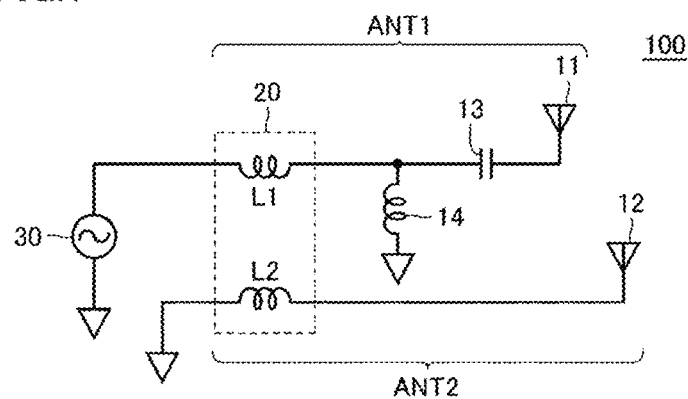
FIG. 1 is a circuit diagram of an antenna device according to an example embodiment of the present invention.

Example embodiments of the present invention will be described in detail below with reference to the drawings. The same or corresponding elements or portions in the drawings are denoted by the same reference signs and a repeated description thereof is not provided.

Example Embodiment

FIG. 1 is a circuit diagram of an antenna device 100 according to an example embodiment of the present invention. The antenna device 100 includes a first antenna ANT1 and a second antenna ANT2. The first antenna ANT1 includes a first radiating element 11 connected to a feed circuit 30, and a first coil L1 connected between the first radiating element 11 and the feed circuit 30. The second antenna ANT2 includes a second coil L2 that magnetically couples to the first coil L1, and a second radiating element 12 connected to the second coil L2. Thus, the first antenna ANT1 is a feed antenna that is supplied with power by the feed circuit 30, and the second antenna ANT2 is a parasitic antenna that is not connected to the feed circuit 30 and is not supplied with power by the feed circuit 30.

In the first antenna ANT1 that is supplied with power, a capacitor 13 connected in series with the first antenna ANT1, and a coil 14 with one end connected to the first antenna ANT1 are provided. The other end of the coil 14 is connected to a GND. The capacitor 13 and the coil 14 define an LC circuit and function as a filter circuit of the first antenna ANT1. If the filter circuit is unnecessary in the first antenna ANT1, the capacitor 13 and the coil 14 do not have to be provided.

In the antenna device 100, the first antenna ANT1 and the second antenna ANT2 are magnetically coupled to each other by the first coil L1 and the second coil L2 to broaden the bandwidth of an available frequency band. That is, the first coil L1 and the second coil L2 define an antenna coupling element 20.

The antenna coupling element 20 is a rectangular or substantially rectangular parallelepiped-shaped chip component mounted to a circuit board in an electronic device. For example, in a case where the antenna coupling element 20 includes a resin multilayer substrate, insulating bases are made of Liquid Crystal Polymer (LCP) sheets. The antenna coupling element 20 is formed by laminating insulating bases in which copper foil has been patterned into conductive traces of the first coil L1 and the second coil L2. Alternatively, for example, in a case where the antenna coupling element 20 includes a ceramic multilayer substrate, insulating bases are made of Low Temperature Co-fired Ceramics (LTCC). The antenna coupling element 20 is formed by laminating insulating bases in which copper paste has been printed and patterned into conductive traces of the first coil L1 and the second coil L2. Furthermore, the antenna coupling element 20 is not limited to the ceramic multilayer substrate and may be formed, for example, by repeating application of insulating paste mainly containing glass by screen-printing. Thus, the insulating bases are a non-magnetic material (are not magnetic ferrite), and, as a result, the antenna coupling element 20 can be used as a transformer with a predetermined inductance and a predetermined coupling coefficient.

As described above, when two radiating elements (the first radiating element 11 and the second radiating element 12) are connected with the antenna coupling element 20, the antenna device 100 can cover a wide band. However, for example, in a case where a frequency band (about 3.3 GHz to about 5.0 GHz) used in the fifth generation mobile communication system (5G), or a frequency band of a 5 GHz band wireless LAN or the like is covered by the antenna device 100, the second antenna ANT2 has to be caused to resonate at a high resonant frequency, and the length of the second radiating element 12 is reduced. However, when the length of the second radiating element 12 is reduced, sufficient radiation efficiency is not achieved in some cases.

Thus, the second antenna ANT2 is not caused to resonate at a resonant frequency of its fundamental but is caused to resonate at a resonant frequency of its harmonic, thus making it possible to increase the length of the second radiating element 12. That is, when a resonant frequency at which the second antenna ANT2 is desired to resonate is, for example, about 4.4 GHz, in a case where the second antenna ANT2 is caused to resonate at a fundamental of about 4.4 GHz, the length of the second radiating element 12 is reduced. However, in a case where the second antenna ANT2 is caused to resonate at a third harmonic of about 4.4 GHz, a resonant frequency of the fundamental is about 1.4 GHz. When the length of the second radiating element 12 is defined by the resonant frequency of the fundamental of about 1.4 GHz, the length of the radiating element can be increased in comparison with a case where the length is defined by a resonant frequency of the fundamental of about 4.4 GHz. In the antenna device 100, the second antenna ANT2 is caused to resonate at a resonant frequency of its harmonic, thus making it possible to increase the length of the second radiating element 12 and achieve sufficient radiation efficiency.

Figure 2:
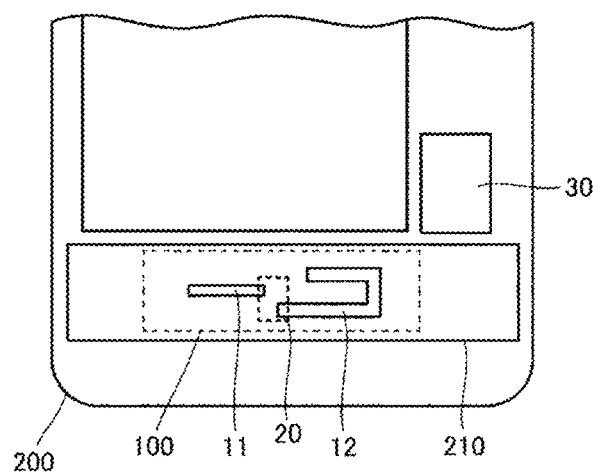
FIG. 2 is a schematic diagram illustrating a communication terminal device according to an example embodiment of the present invention.

Specifically, the lengths of the first radiating element 11 and the second radiating element 12 will be described. FIG. 2 is a schematic diagram illustrating a communication terminal device according to the present example embodiment. The communication terminal device illustrated in FIG. 2 is a mobile terminal 200 capable of performing communication in, for example, a band including n78 (about 3.3 GHz to about 3.8 GHz) and a band including n79 (about 4.4 GHz to about 4.9 GHz). For this reason, in the mobile terminal 200, the antenna device 100 including the first antenna ANT1 that is excited in the band including n78 and the second antenna ANT2 that is excited in the band including n79 is provided. The mobile terminal 200 is, for example, a mobile phone, smartphone, or tablet.

In the antenna device 100, the antenna coupling element 20 is provided at a back side of a substrate 210 subjected to patterning of the first radiating element 11 and the second radiating element 12, and the antenna coupling element 20 couples the first antenna ANT1 and the second antenna ANT2. Furthermore, although the first antenna ANT1 is electrically connected to the feed circuit 30 with a line, which is not illustrated, the second antenna ANT2 is not electrically connected to the feed circuit 30.

As illustrated in FIG. 2, the first radiating element 11 is defined by a linear conductive trace extending leftward in FIG. 2 from the antenna coupling element 20. Furthermore, the second radiating element 12 is defined by a linear conductive trace extending rightward in FIG. 2 from the antenna coupling element 20 and folded back leftward in FIG. 2 at some point in the trace. Both the first radiating element 11 and the second radiating element 12 define and function as a monopole antenna.

Since the first antenna ANT1 is excited in the band including n78 and the second antenna ANT2 is excited in the band including n79, in a case where the first antenna ANT1 and the second antenna ANT2 are caused to resonate at resonant frequencies of respective fundamentals, the length of the first radiating element 11 is longer than the length of the second radiating element 12. However, since the second antenna ANT2 is caused to resonate at a resonant frequency of its third harmonic, the length of the second radiating element 12 is longer than the length of the first radiating element 11 as illustrated in FIG. 2.

Even in a case where the second antenna ANT2 is caused to resonate at a resonant frequency of its harmonic, the second antenna ANT2 resonates at a resonant frequency of its fundamental. If a frequency band covered by the antenna device 100 does not include the resonant frequency of the fundamental of the second antenna ANT2, when the second antenna ANT2 resonates at the resonant frequency of the fundamental, the antenna device 100 receives an interference wave in a frequency band other than the covered frequency band, resulting in deterioration of communication performance.

Thus, in the antenna device 100, an impedance is adjusted so that resonance does not occur at the resonant frequency of the fundamental of the second antenna ANT2. Specifically, in the antenna device 100, an impedance of the first antenna ANT1 is adjusted so as to exceed, for example, about 50Ω at the resonant frequency of the fundamental of the second antenna ANT2. A figure of about 50Ω is a reference value used in typical antenna design. When the impedance is higher than this, a value of current that flows through circuitry decreases. Furthermore, in typical antenna design, an impedance on an input side of the feed circuit 30 also corresponds to the vicinity of 50Ω. Thus, a case where "a target impedance is higher than about 50Ω" corresponds to a case where "a target impedance is higher than an impedance on the input side of the feed circuit 30". Furthermore, in the present description, as for comparison between magnitudes of impedances, a comparison is performed by using an absolute value in which a real part and an imaginary part of an impedance are taken into consideration.

Figure 3:
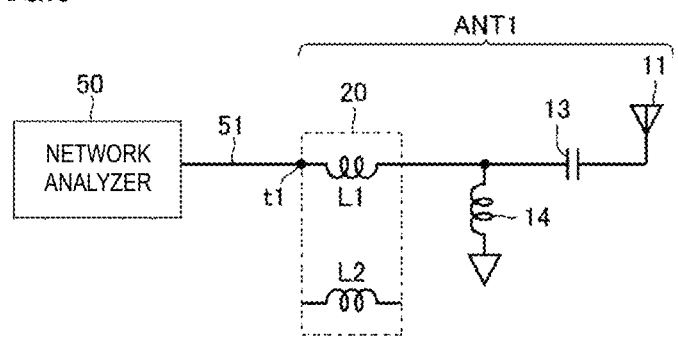
FIG. 3 is a schematic diagram illustrating a configuration in a case where an impedance of a first antenna according to an example embodiment of the present invention is measured.

Here, FIG. 3 is a schematic diagram illustrating a configuration in a case where an impedance of the first antenna ANT1 according to the present example embodiment is measured. An impedance of the first antenna ANT1 is measured in a first measurement state in which, as illustrated in FIG. 3, a network analyzer 50 is connected to the first coil L1 in place of the feed circuit 30 with a measurement cable 51. At this time, if the first coil L1 and the second coil L2 have been integrated into a single element and are difficult to separate, the second radiating element 12 and the GND are disconnected from the second coil L2 to open-circuit both ends of the second coil L2. In the first measurement state, a connection point between the first coil L1 and the measurement cable 51 is used as a measurement point t1, and frequency characteristics of the impedance of the first antenna ANT1 are measured by the network analyzer 50. As for a phase shift based on the length of the measurement cable 51, calibration is performed in advance using the connection point between the measurement cable 51 and the first coil L1, which is a primary coil of the transformer.

Figure 4:
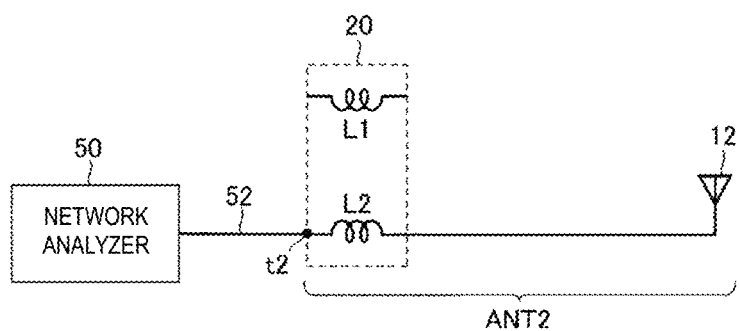
FIG. 4 is a schematic diagram illustrating a configuration in a case where an impedance of a second antenna according to an example embodiment of the present invention is measured.

Furthermore, FIG. 4 is a schematic diagram illustrating a configuration in a case where an impedance of the second antenna ANT2 according to the present example embodiment is measured. A resonant frequency of a fundamental of the second antenna ANT2 is measured in a second measurement state in which, as illustrated in FIG. 4, the network analyzer 50 is connected to the second coil L2 with a measurement cable 52 instead of being connected to the GND. At this time, if the first coil L1 and the second coil L2 have been integrated into a single element and are difficult to separate, the first radiating element 11 and the feed circuit 30 are disconnected from the first coil L1 to open-circuit both ends of the first coil L1. In the second measurement state, a connection point between the second coil L2 and the measurement cable 52 is used as a measurement point t2, and frequency characteristics of the fundamental of the second antenna ANT2 are measured by the network analyzer 50. Through this measurement, a resonant frequency of the parasitic element can be determined. As for a phase shift based on the length of the measurement cable 52, calibration is performed in advance using the connection point between the measurement cable 52 and the second coil L2, which is a secondary coil of the transformer. Through the measurements in the above-described first and second measurement states, an impedance of the first antenna ANT1 at the resonant frequency of the fundamental of the second antenna ANT2 can be determined.

In the antenna device 100, when the impedance of the first antenna ANT1 is higher than about 50Ω at the resonant frequency of the fundamental of the second antenna ANT2, a current that flows through the first coil L1 (the primary coil of the transformer) decreases at the resonant frequency of the fundamental of the second antenna ANT2. For this reason, an induced electromotive force generated in the second coil L2 (the secondary coil of the transformer) also decreases. Even when the second antenna ANT2 itself resonates at the resonant frequency of the fundamental, the entire antenna device 100 does not resonate at the resonant frequency of the fundamental of the second antenna ANT2.

Figure 5:
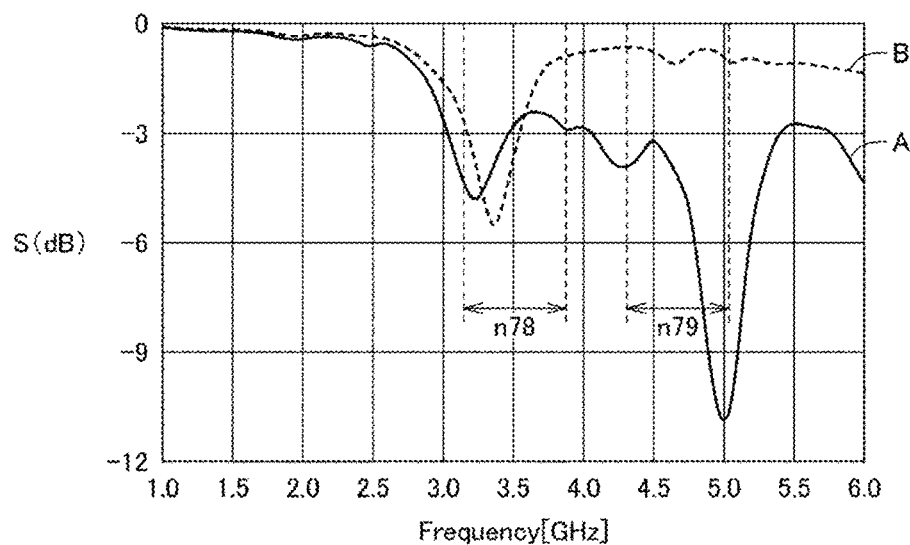
FIG. 5 is a graph illustrating frequency characteristics of reflection coefficients of an antenna device according to an example embodiment of the present invention.

FIG. 5 is a graph illustrating frequency characteristics of reflection coefficients of the antenna device 100 according to the present example embodiment. In FIG. 5, the horizontal axis represents frequency, and the vertical axis represents reflection coefficient. Here, a reflection coefficient A is as seen from the feed circuit 30 toward the antenna coupling element 20 in FIG. 1 (that is, a reflection coefficient of the antenna device 100). Furthermore, a reflection coefficient B is as seen from the first coil L1 toward the first radiating element 11 in FIG. 1 (that is, a reflection coefficient of the first antenna ANT1).

In the reflection coefficient A, resonance occurs at a resonant frequency of a fundamental of the first antenna ANT1 (a resonant frequency based on the first coil L1 and the first radiating element 11) in the band including n78, and resonance occurs at a resonant frequency (for example, about 4.8 GHz) of a third harmonic based on the second antenna ANT2 in the band including n79. On the other hand, in the reflection coefficient B, resonance occurs at the resonant frequency of the fundamental of the first antenna ANT1 in the band including n78. That is, in the antenna device 100, when the second antenna ANT2 is coupled to the first antenna ANT1 with the antenna coupling element 20, the bandwidth can be broadened to include the band including n79. When the impedance is adjusted as described above in the antenna device 100, no resonance is observed at the resonant frequency (for example, about 1.5 GHz) of the fundamental of the second antenna ANT2 in the reflection coefficient A. That is, the antenna device 100 does not operate at the resonant frequency of the fundamental of the second antenna ANT2.

Figure 6:
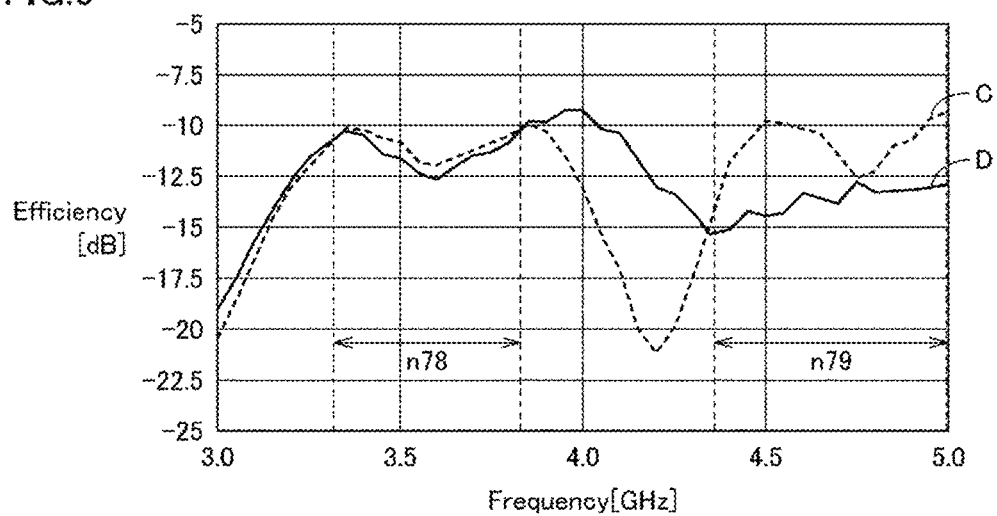
FIG. 6 is a graph for explaining radiation efficiency of an antenna device according to an example embodiment of the present invention.

FIG. 6 is a graph for explaining radiation efficiency of the antenna device 100 according to the present example embodiment. In FIG. 6, the horizontal axis represents frequency, and the vertical axis represents radiation efficiency. In FIG. 6, a characteristic C represents frequency characteristics of radiation efficiency of the antenna device 100 exhibited when the second antenna ANT2 is caused to resonate at a resonant frequency of its third harmonic, and a characteristic D represents frequency characteristics of radiation efficiency of the antenna device 100 exhibited when the second antenna ANT2 is caused to resonate at a resonant frequency of its fundamental. When the second antenna ANT2 is caused to resonate at the resonant frequency of the third harmonic, the length of the second radiating element 12 can be increased, and thus the antenna device 100 is improved in terms of radiation efficiency in the band including n79 as indicated by the characteristic C.

Figure 7A:
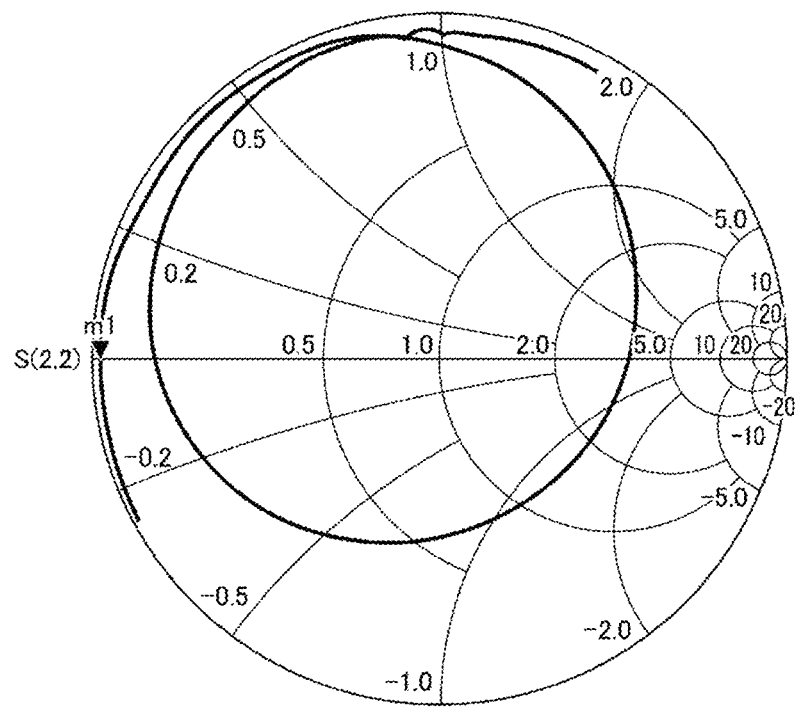
FIGS. 7A and 7B include Smith charts when an impedance of an antenna device according to an example embodiment of the present invention is adjusted to a first state.
Figure 7B:
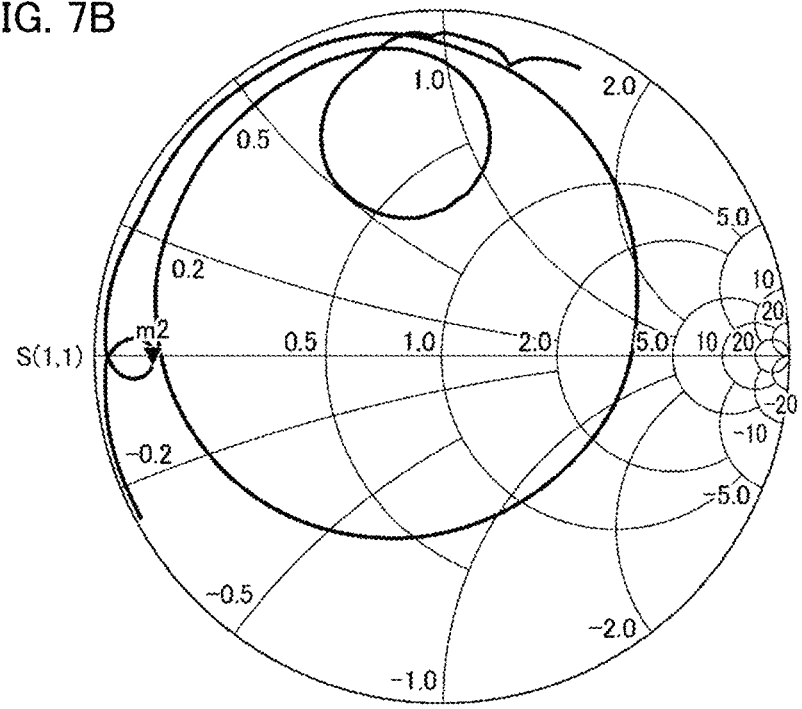
Figure 8A:
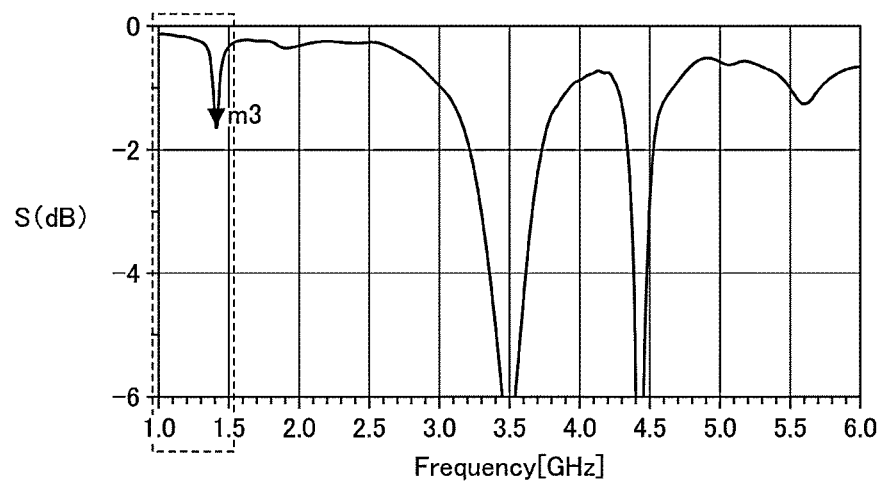
FIGS. 8A and 8B include graphs for explaining antenna characteristics exhibited when an impedance of an antenna device according to an example embodiment of the present invention is adjusted to a first state.
Figure 8B:
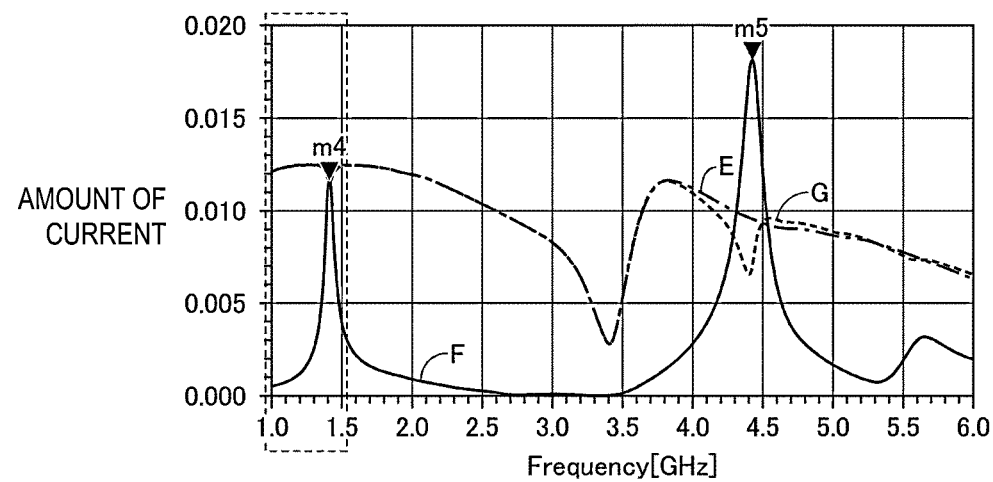

Next, impedance adjustment will be described in which the antenna device 100 is not caused to operate at the resonant frequency of the fundamental of the second antenna ANT2. FIGS. 7A and 7B include Smith charts when an impedance of the antenna device 100 according to the present example embodiment is adjusted to a first state. FIGS. 8A and 8B include graphs for explaining antenna characteristics exhibited when the impedance of the antenna device 100 according to the present example embodiment is adjusted to the first state.

The Smith charts illustrated in FIGS. 7A and 7B represent a case where a phase shifter (not illustrated) is provided between the first coil L1 and the first radiating element 11 of the antenna device 100 illustrated in FIG. 1 to adjust the impedance of the first antenna ANT1 to a first state. Here, the first state is a state in which a phase of a reflection coefficient of the first antenna ANT1 based on the feed circuit 30 in the first measurement state is positioned in the vicinity of about 180 degrees by the phase shifter. The phase of the reflection coefficient refers to an angle counterclockwise from an X axis on the right side of the center of a Smith chart to a line connecting a point at a target frequency and the center.

Figure 9A:
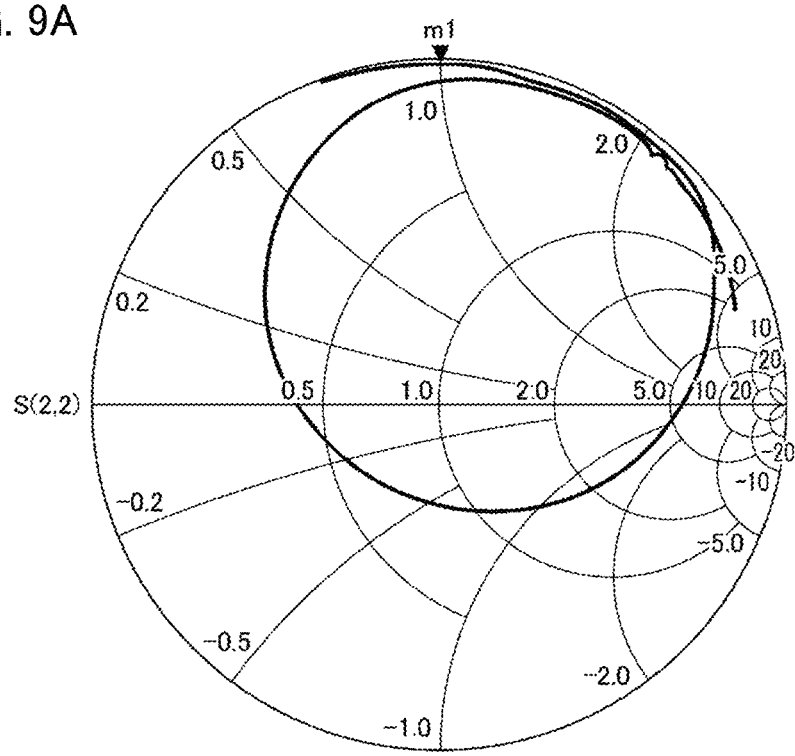
FIGS. 9A and 9B include Smith charts when an impedance of an antenna device according to an example embodiment of the present invention is adjusted to a second state.
Figure 9B:
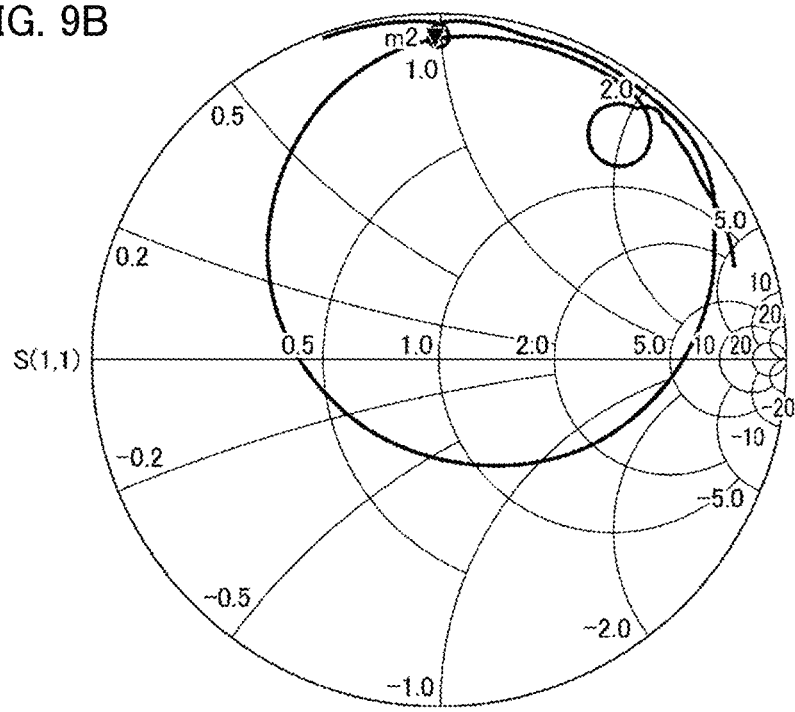
Figure 10A:
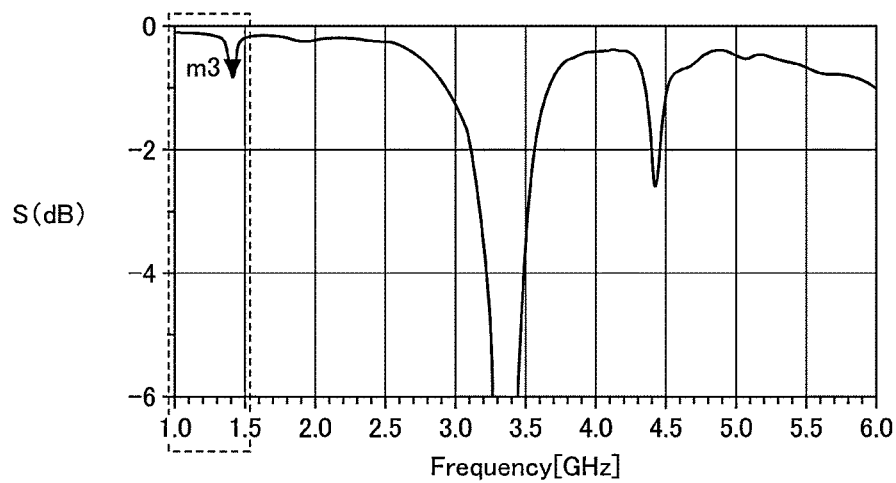
FIGS. 10A and 10B include graphs for explaining antenna characteristics exhibited when an impedance of an antenna device according to an example embodiment of the present invention is adjusted to a second state.
Figure 10B:
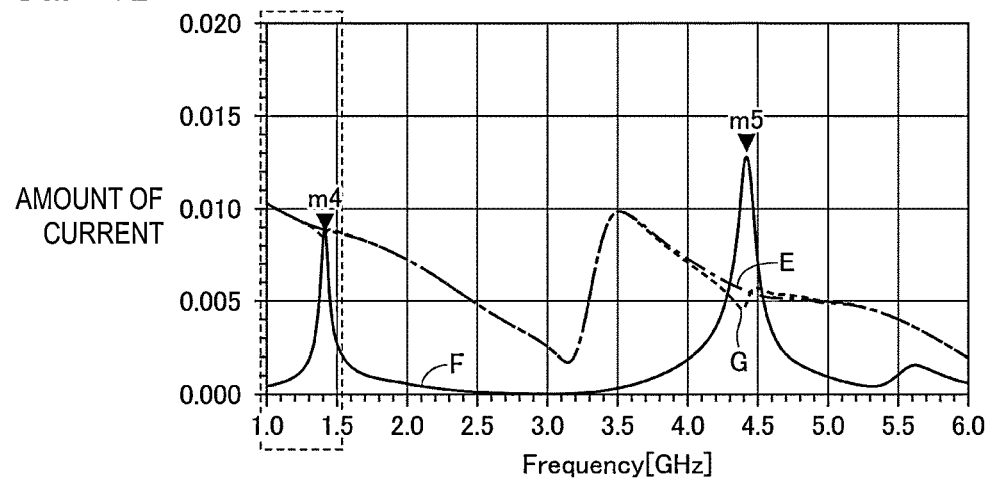

Similarly, FIGS. 9A and 9B include Smith charts when an impedance of the antenna device 100 according to the present example embodiment is adjusted to a second state. FIGS. 10A and 10B include graphs for explaining antenna characteristics exhibited when the impedance of the antenna device 100 according to the present example embodiment is adjusted to the second state. Here, the second state is a state in which the phase of the reflection coefficient of the first antenna ANT1 based on the feed circuit 30 in the first measurement state is positioned in the vicinity of about 90 degrees by the phase shifter. Furthermore, the second state is also a state in which a phase difference between a voltage and a current is situated in the vicinity of about 90 degrees.

Figure 11A:
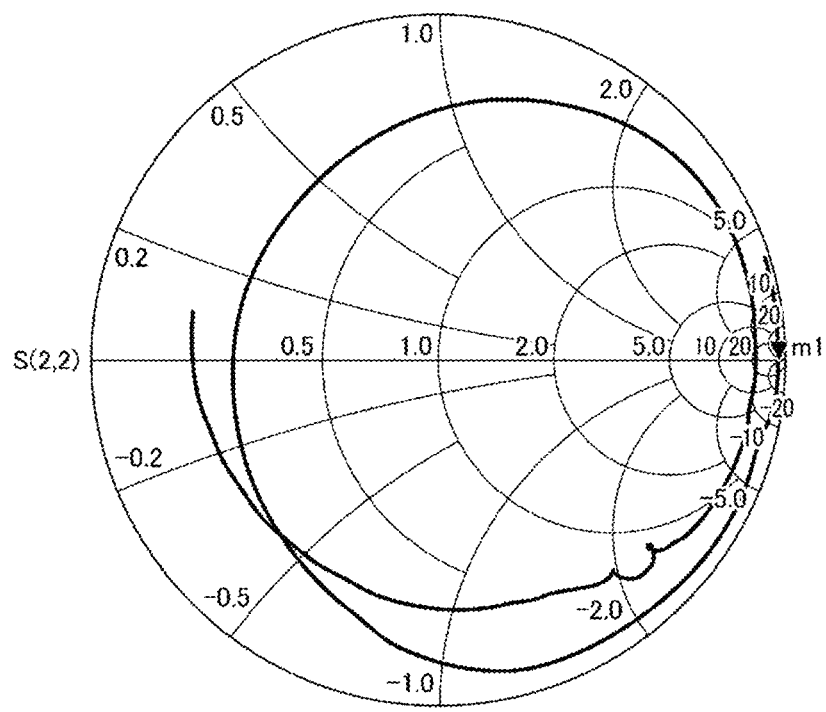
FIGS. 11A and 11B include Smith charts when an impedance of an antenna device according to an example embodiment of the present invention is adjusted to a third state.
Figure 11B:
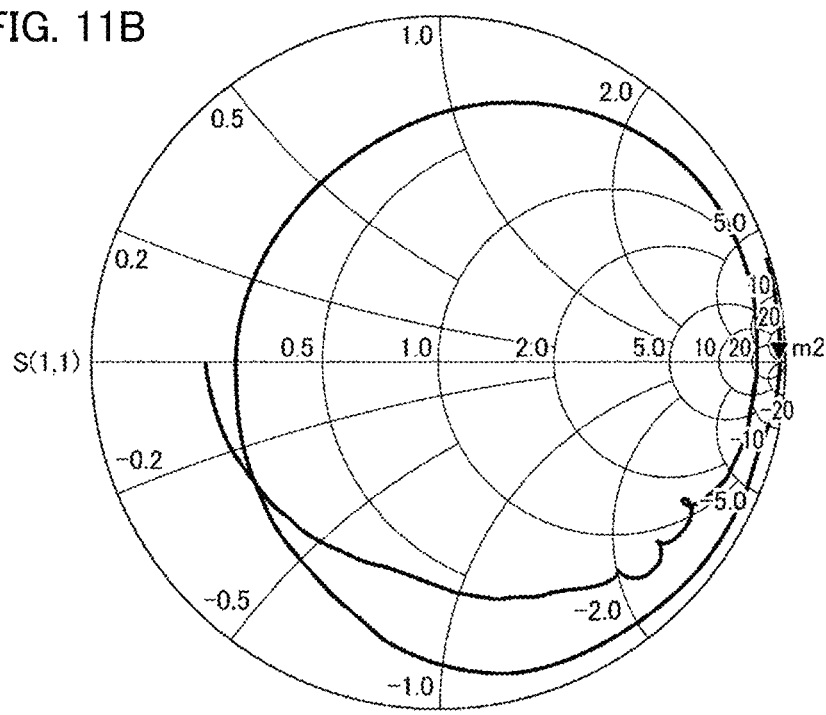
Figure 12A:
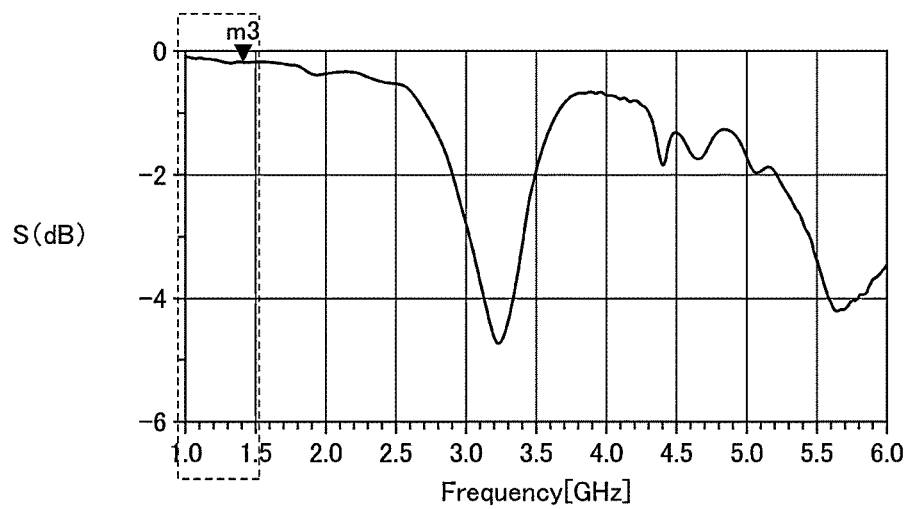
FIGS. 12A and 12B include graphs for explaining antenna characteristics exhibited when an impedance of an antenna device according to an example embodiment of the present invention is adjusted to a third state.
Figure 12B:
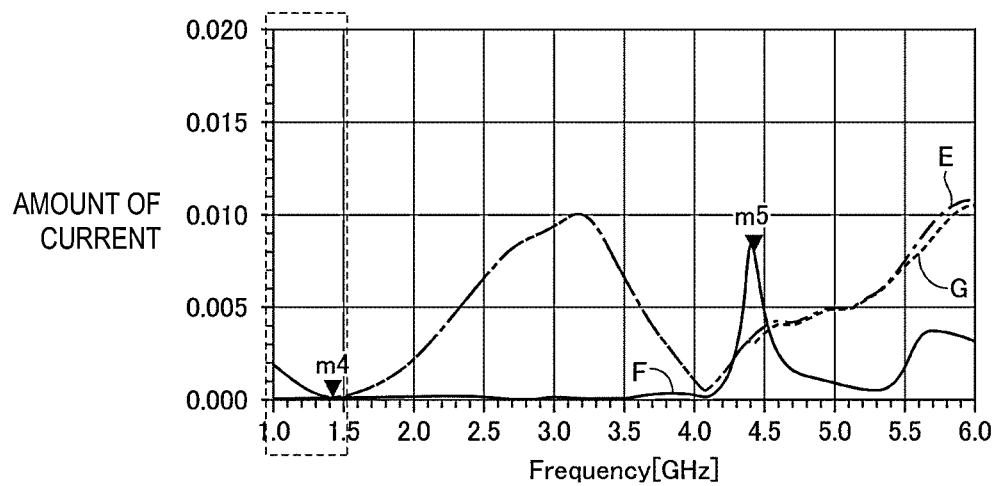

FIGS. 11A and 11B include Smith charts when an impedance of the antenna device 100 according to the present example embodiment is adjusted to a third state. FIGS. 12A and 12B include graphs for explaining antenna characteristics exhibited when the impedance of the antenna device 100 according to the present example embodiment is adjusted to the third state. Here, the third state is a state in which the phase of the reflection coefficient of the first antenna ANT1 based on the feed circuit 30 in the first measurement state is positioned in the vicinity of about 0 (zero) degrees by the phase shifter. Furthermore, the third state is also a state in which a phase difference between a voltage and a current is situated in the vicinity of about 180 degrees.

Figure 13A:
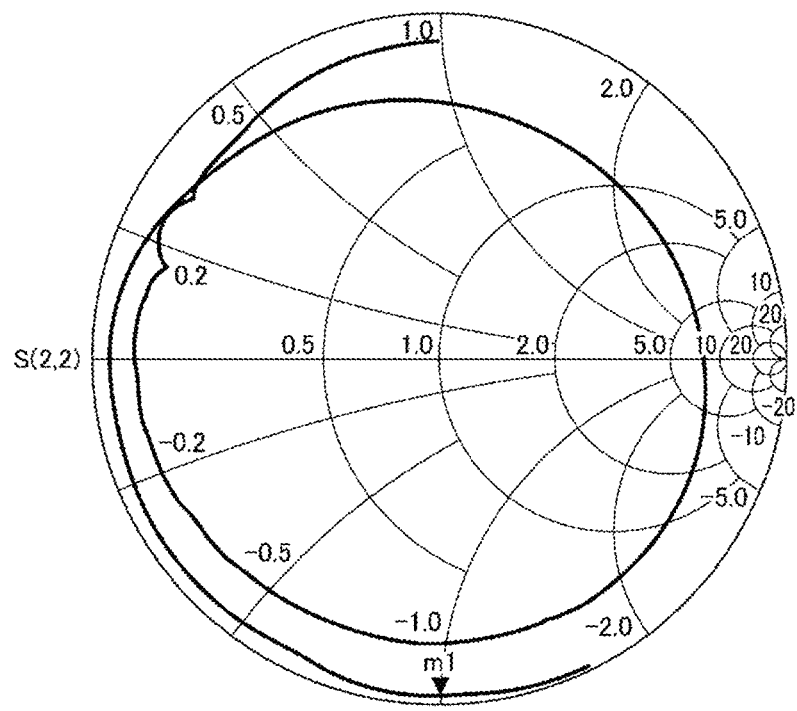
FIGS. 13A and 13B include Smith charts when an impedance of an antenna device according to an example embodiment of the present invention is adjusted to a fourth state.
Figure 13B:
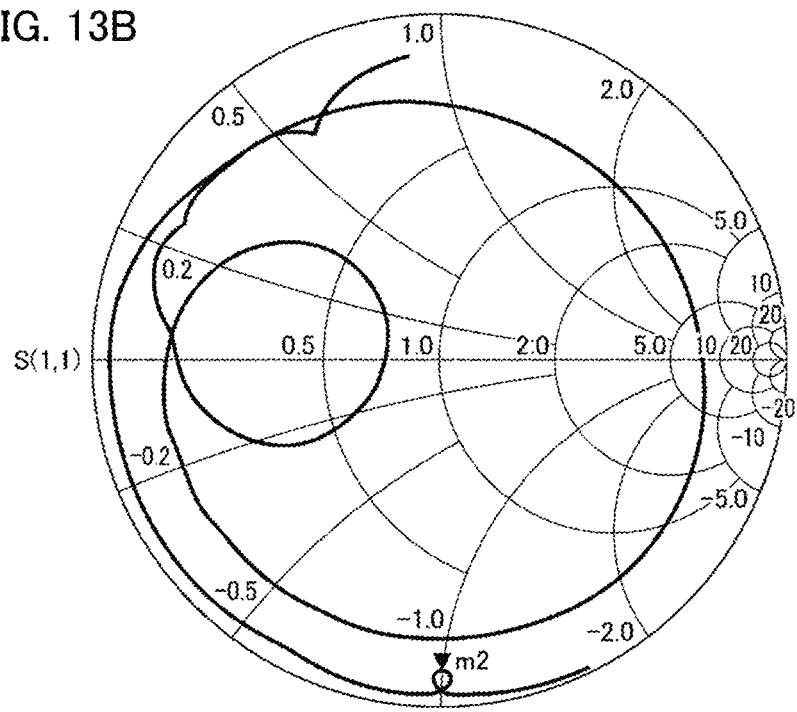
Figure 14A:
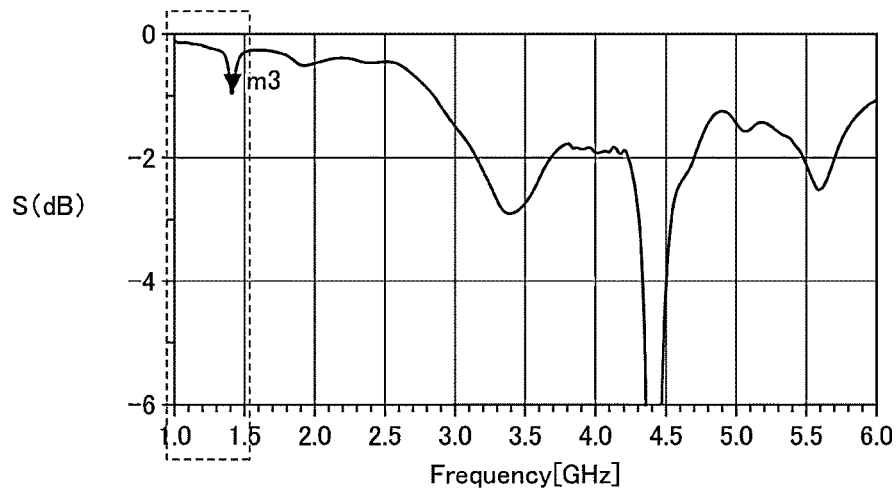
FIGS. 14A and 14B include graphs for explaining antenna characteristics exhibited when an impedance of an antenna device according to an example embodiment of the present invention is adjusted to a fourth state.
Figure 14B:
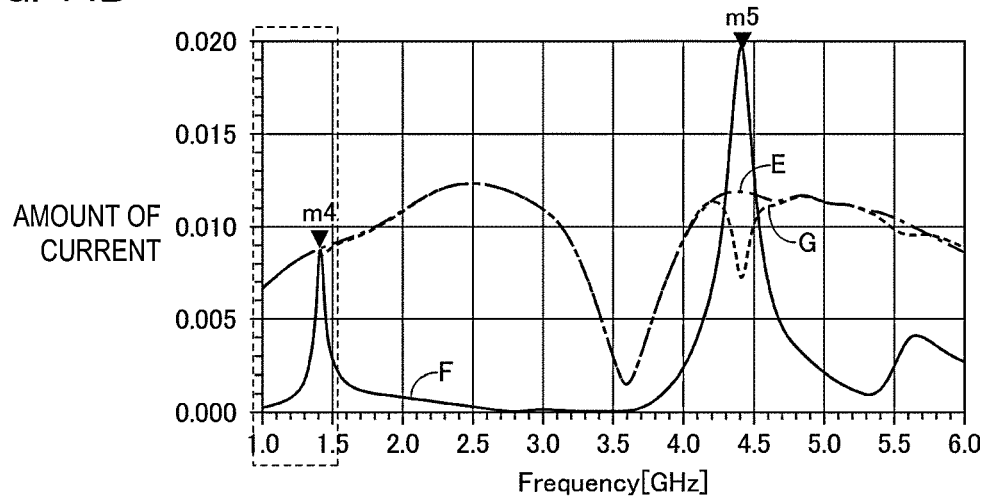

FIGS. 13A and 13B include Smith charts when an impedance of the antenna device 100 according to the present example embodiment is adjusted to a fourth state. FIGS. 14A and 14B include graphs for explaining antenna characteristics exhibited when the impedance of the antenna device 100 according to the present example embodiment is adjusted to the fourth state. Here, the fourth state is a state in which the phase of the reflection coefficient of the first antenna ANT1 based on the feed circuit 30 in the first measurement state is positioned in the vicinity of about −90 degrees by the phase shifter. Furthermore, the fourth state is also a state in which a phase difference between a voltage and a current is situated in the vicinity of about −90 degrees.

In FIGS. 7A to 14B, to explain the relationship between an impedance of the first antenna ANT1 and characteristics of the antenna device 100, the phase shifter is provided in the antenna device 100 to change the impedance of the first antenna ANT1. However, the phase shifter does not necessarily have to be provided in the antenna device 100 according to the present example embodiment. That is, in the antenna device 100 according to the present example embodiment, the phase shifter does not have to be provided as long as the impedance is adjusted by a circuit configuration so that the antenna device 100 does not operate at the resonant frequency of the fundamental of the second antenna ANT2.

Table 1 represents changes in the impedance of the first antenna ANT1 at the resonant frequency of the fundamental of the second antenna ANT2. Table 1 represents changes in the impedance of the first antenna ANT1 exhibited when the phase (difference) of the reflection coefficient is changed to about 180 degrees, about 90 degrees, about 0 degrees, and about −90 degrees. In Table 1, Re{Z} denotes a real part of the impedance, and Im{Z} denotes an imaginary part of the impedance. Furthermore, in Table 1, all impedances on the input side of the feed circuit 30 are about 50.0Ω. As for comparison between magnitudes of impedances, a comparison is performed by using an absolute value in which a real part and an imaginary part of an impedance are taken into consideration.

TABLE 1

| PHASE [DEGREES] | Re{Z} [Ω] | Im{Z} [Ω] | |Z| [Ω] | IMPEDANCE [Ω] OF FEED CIRCUIT |
|---|---|---|---|---|
| 180 | 0.5 | 0.0 | 0.5 | 50.0 |
| 90 | 0.8 | 50.0 | 50.0 | 50.0 |
| 0 | 49270.0 | −210.6 | 49270.5 | 50.0 |
| −90 | 1.3 | −50.0 | 50.0 | 50.0 |

FIGS. 7A, 9A, 11A, and 13A represent, on the Smith charts, the locus of an impedance as seen from a first radiating element 11 side looking toward the individual first antenna ANT1 to which the second antenna ANT2 is not coupled. A mark m1 denotes the impedance of the first antenna ANT1 at the resonant frequency of the fundamental of the second antenna ANT2. As illustrated in FIGS. 7A, 9A, 11A, and 13A, the mark m1 moves clockwise as the phase difference of the reflection coefficient is changed to about 180 degrees, about 90 degrees, about 0 degrees, and about −90 degrees. The Smith charts illustrated in FIGS. 7A, 9A, 11A, and 13A are normalized by using about 50Ω, and thus the impedance of the first antenna ANT1 is higher than about 50Ω at phase differences of about 90 degrees or less and about −90 degrees or more of the reflection coefficient. In other words, when a point at a target frequency exists in the right half of each Smith chart, the impedance of the first antenna ANT1 is higher than about 50Ω.

FIGS. 7B, 9B, 11B, and 13B represent, on the Smith charts, the locus of an impedance as seen from a feed circuit 30 side looking toward the entire antenna device 100 to which the second antenna ANT2 is coupled. A mark m2 denotes the impedance of the entire antenna device 100 at the resonant frequency of the fundamental of the second antenna ANT2. As illustrated in FIGS. 7B, 9B, 11B, and 13B, the mark m2 moves clockwise as the phase difference of the reflection coefficient is changed to about 180 degrees, about 90 degrees, about 0 degrees, and about −90 degrees. The Smith charts illustrated in FIGS. 7B, 9B, 11B, and 13B are normalized by using about 50Ω, and thus the impedance of the entire antenna device 100 is higher than about 50Ω at phase differences of about 90 degrees or less and about 270 degrees or more. In other words, when a point at a target frequency exists in the right half of each Smith chart, the impedance of the entire antenna device 100 is higher than about 50Ω.

FIGS. 8A, 10A, 12A, and 14A are graphs illustrating frequency characteristics of the reflection coefficient of the antenna device 100 exhibited when the phase difference of the reflection coefficient is changed to about 180 degrees, about 90 degrees, about 0 degrees, and about −90 degrees. In FIGS. 8A, 10A, 12A, and 14A, the horizontal axis represents frequency, and the vertical axis represents reflection coefficient. A mark m3 denotes a peak of the reflection coefficient of the antenna device 100 at the resonant frequency of the fundamental of the second antenna ANT2. The peak of the reflection coefficient denoted by the mark m3 decreases as the phase difference is changed to about 180 degrees, about 90 degrees, and about 0 degrees, and the peak increases as the phase difference is changed to about 0 degrees and about −90 degrees.

FIGS. 8B, 10B, 12B, and 14B are graphs illustrating frequency characteristics of the amount of current that flows through the antenna device 100 exhibited when the phase difference of the reflection coefficient is changed to about 180 degrees, about 90 degrees, about 0 degrees, and about −90 degrees. In FIGS. 8B, 10B, 12B, and 14B, the horizontal axis represents frequency, and the vertical axis represents the amount of current. A characteristic E represents frequency characteristics of the amount of current that flows through the first antenna ANT1, a characteristic F represents frequency characteristics of the amount of current that flows through the second antenna ANT2, and a characteristic G represents frequency characteristics of the amount of current that flows through the entire antenna device 100. A mark m4 denotes the amount of current that flows through the second antenna ANT2 at the resonant frequency of the fundamental of the second antenna ANT2. A region surrounded by a dashed line refers to a range of the resonant frequency of the fundamental of the second antenna ANT2. A mark m5 denotes the amount of current that flows through the second antenna ANT2 at the resonant frequency of the third harmonic of the second antenna ANT2. The amount of current that flows through the second antenna ANT2 denoted by each of the marks m4 and m5 decreases as the phase difference is changed to about 180 degrees, about 90 degrees, and about 0 degrees, and the amount of current increases as the phase difference is changed to about 0 degrees and about −90 degrees. In particular, when the phase difference of the reflection coefficient is about 0 (zero) degrees, the amount of current that flows through the second antenna ANT2 denoted by the mark m4 is substantially 0 (zero).

As illustrated in FIGS. 8B, 10B, and 12B, the amount of current (mark m4) that flows through the second antenna ANT2 decreases as the phase difference of the reflection coefficient is changed to about 180 degrees, about 90 degrees, and about 0 degrees. On the other hand, as illustrated in FIGS. 7B, 9B, and 11B, the impedance (mark m2) of the entire antenna device 100 increases as the phase difference is changed to about 180 degrees, about 90 degrees, and about 0 degrees. That is, in the antenna device 100, when the impedance is increased at the resonant frequency of the fundamental of the second antenna ANT2, a current that flows through the first coil L1 (the primary coil of the transformer) decreases, and thus an induced electromotive force generated in the second coil L2 (the secondary coil of the transformer) also decreases.

As illustrated in FIGS. 8B, 10B, and 12B, when the amount of current (mark m4) that flows through the second antenna ANT2 decreases as the phase difference of the reflection coefficient is changed to about 180 degrees, about 90 degrees, and about 0 degrees, the peak (mark m3) of the reflection coefficient illustrated in FIGS. 8A, 10A, and 12A decreases. That is, when an induced electromotive force generated in the second coil L2 (the secondary coil of the transformer) at the resonant frequency of the fundamental of the second antenna ANT2 decreases, the antenna device 100 does not resonate at the resonant frequency of the fundamental of the second antenna ANT2.

On the other hand, as illustrated in FIGS. 8B, 10B, and 12B, although the amount of current (mark m5) that flows through the second antenna ANT2 also decreases as the phase difference of the reflection coefficient is changed to about 180 degrees, about 90 degrees, and about 0 degrees, the amount of current does not reach substantially 0 (zero) as the mark m4 does. For this reason, although an induced electromotive force generated in the second coil L2 (the secondary coil of the transformer) at the resonant frequency of the third harmonic of the second antenna ANT2 also decreases, the antenna device 100 resonates at the resonant frequency of the third harmonic of the second antenna ANT2.

As described above, in the antenna device 100, the impedance of the first antenna ANT1 is adjusted so as to exceed about 50Ω at the resonant frequency of the fundamental of the second antenna ANT2. That is, in the antenna device 100, the impedance of the first antenna ANT1 is adjusted to be located in the right half of a Smith chart (phase differences of about 90 degrees or less and about 270 degrees or more). Thus, the antenna device 100 makes it difficult for resonance to occur at the resonant frequency of the fundamental of the second antenna ANT2, enabling an improvement in communication performance.

As described above, the antenna device 100 according to the present example embodiment includes the first antenna ANT1 and the second antenna ANT2. The first antenna ANT1 includes the first radiating element 11 connected to the feed circuit 30 that supplies a radio-frequency signal, and the first coil L1 connected between the first radiating element 11 and the feed circuit 30. The second antenna ANT2 includes the second coil L2 that magnetically couples to the first coil L1, and the second radiating element 12 connected to the second coil L2. The impedance of the first antenna ANT1 is higher than about 50Ω at the resonant frequency of the fundamental of the second antenna ANT2.

Thus, in the antenna device 100 according to the present example embodiment, when the impedance of the first antenna ANT1 is adjusted, the bandwidth of a frequency band that is used can be broadened, and sufficient radiation efficiency can also be achieved.

The resonant frequency of the fundamental of the first antenna ANT1 is preferably lower than a resonant frequency of a harmonic of the second antenna ANT2. This can broaden the bandwidth of a frequency band that is used.

The length of the second radiating element 12 is preferably longer than the length of the first radiating element 11. This can improve radiation efficiency of the second antenna ANT2.

The mobile terminal 200 (communication terminal device) includes the feed circuit 30, and the above-described antenna device 100. Thus, the mobile terminal 200 can perform stable communication in a wide band.

Modification 1

Figure 15:
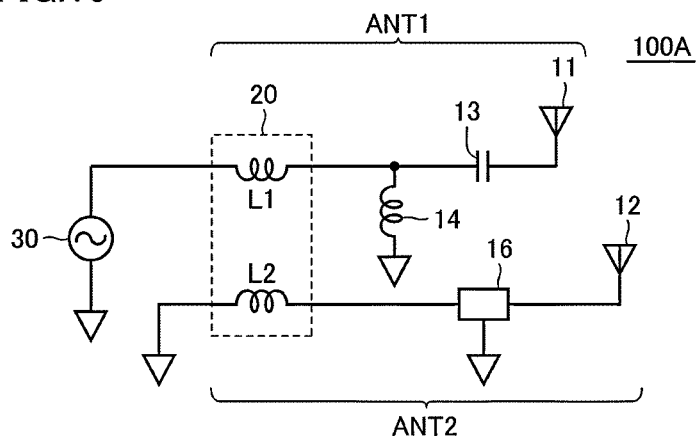
FIG. 15 is a circuit diagram of an antenna device according to Modification 1 of an example embodiment of the present invention.

FIG. 15 is a circuit diagram of an antenna device 100A according to Modification 1 of an example embodiment of the present invention. In the antenna device 100A illustrated in FIG. 15, components that are the same or substantially the same as those in the antenna device 100 illustrated in FIG. 1 are denoted by the same reference signs and a detailed description thereof is not repeated.

The antenna device 100A includes the first antenna ANT1 and the second antenna ANT2. The first antenna ANT1 includes the first radiating element 11 connected to the feed circuit 30, and the first coil L1 connected between the first radiating element 11 and the feed circuit 30. The second antenna ANT2 includes the second coil L2 that magnetically couples to the first coil L1, and the second radiating element 12 connected to the second coil L2. Furthermore, in the antenna device 100A, an impedance matching element 16 is connected between the second coil L2 and the second radiating element 12.

When the impedance matching element 16 is provided in the second antenna ANT2, an impedance can be increased at the resonant frequency of the fundamental of the second antenna ANT2. When the impedance is increased by the impedance matching element 16, the amount of current that flows through the second antenna ANT2 at the resonant frequency of the fundamental of the second antenna ANT2 can be further reduced.

As described above, the antenna device 100A according to Modification 1 further includes the impedance matching element 16 (second impedance matching element) connected between the second coil L2 and the second radiating element 12. Thus, in the antenna device 100A according to Modification 1, the amount of current that flows through the second antenna ANT2 at the resonant frequency of the fundamental of the second antenna ANT2 can be further reduced.

Modification 2

Figure 16:
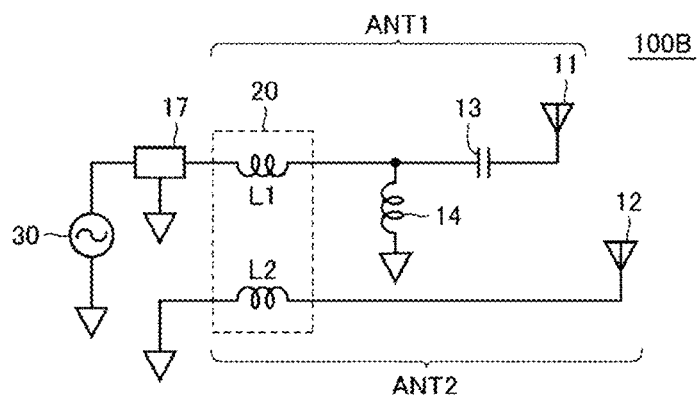
FIG. 16 is a circuit diagram of an antenna device according to Modification 2 of an example embodiment of the present invention.

FIG. 16 is a circuit diagram of an antenna device 100B according to Modification 2 of an example embodiment of the present invention. In the antenna device 100B illustrated in FIG. 16, components that are the same or substantially the same as those in the antenna device 100 illustrated in FIG. 1 are denoted by the same reference signs and a detailed description thereof is not repeated.

The antenna device 100B includes the first antenna ANT1 and the second antenna ANT2. The first antenna ANT1 includes the first radiating element 11 connected to the feed circuit 30, and the first coil L1 connected between the first radiating element 11 and the feed circuit 30. The second antenna ANT2 includes the second coil L2 that magnetically couples to the first coil L1, and the second radiating element 12 connected to the second coil L2. Furthermore, in the antenna device 100B, an impedance matching element 17 is connected between the first coil L1 and the feed circuit 30.

When the impedance matching element 17 is provided in the first antenna ANT1, a current that flows through the first coil L1 (the primary coil of the transformer) at the resonant frequency of the fundamental of the second antenna ANT2 can be shunted. When the current that flows through the first coil L1 (the primary coil of the transformer) is shunted by the impedance matching element 17, the amount of current that flows through the second antenna ANT2 at the resonant frequency of the fundamental of the second antenna ANT2 can be further reduced. At this time, the impedance matching element 17 is a portion of the first antenna ANT1, and an impedance of the first antenna ANT1 including the impedance matching element 17 is measured.

As described above, the antenna device 100B according to Modification 2 further includes the impedance matching element 17 (first impedance matching element) connected between the first coil L1 and the feed circuit 30. Thus, in the antenna device 100B according to Modification 2, the amount of current that flows through the second antenna ANT2 at the resonant frequency of the fundamental of the second antenna ANT2 can be further reduced.

Modification 3

Figure 17:
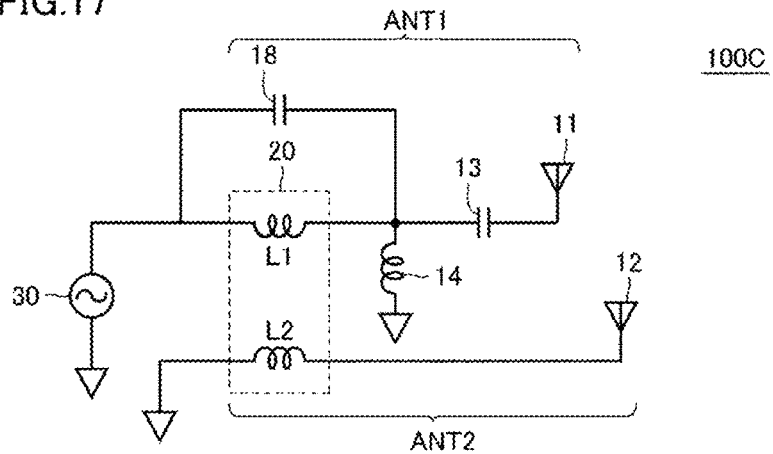
FIG. 17 is a circuit diagram of an antenna device according to Modification 3 of an example embodiment of the present invention.

FIG. 17 is a circuit diagram of an antenna device 100C according to Modification 3 of an example embodiment of the present invention. In the antenna device 100C illustrated in FIG. 17, components that are the same or substantially the same as those in the antenna device 100 illustrated in FIG. 1 are denoted by the same reference signs and a detailed description thereof is not repeated.

The antenna device 100C includes the first antenna ANT1 and the second antenna ANT2. The first antenna ANT1 includes the first radiating element 11 connected to the feed circuit 30, and the first coil L1 connected between the first radiating element 11 and the feed circuit 30. The second antenna ANT2 includes the second coil L2 that magnetically couples to the first coil L1, and the second radiating element 12 connected to the second coil L2. Furthermore, in the antenna device 100C, a capacitor 18 is connected in parallel with the first coil L1.

In a case where the second antenna ANT2 is caused to resonate at a resonant frequency of its third harmonic, when the capacitor 18 is connected in parallel with the first coil L1, a signal with a resonant frequency of a harmonic equal to or higher than a fifth harmonic can be caused to bypass the transformer (the first coil L1). Thus, resonance can be prevented from occurring at a resonant frequency of a harmonic equal to or higher than an unwanted fifth harmonic in the second antenna ANT2.

As described above, the antenna device 100C according to Modification 3 further includes the capacitor 18 connected in parallel with the first coil L1. Thus, in the antenna device 100C according to Modification 3, resonance can be prevented from occurring at a resonant frequency of a harmonic equal to or higher than the unwanted fifth harmonic in the second antenna ANT2.

Modification 4

Figure 18:
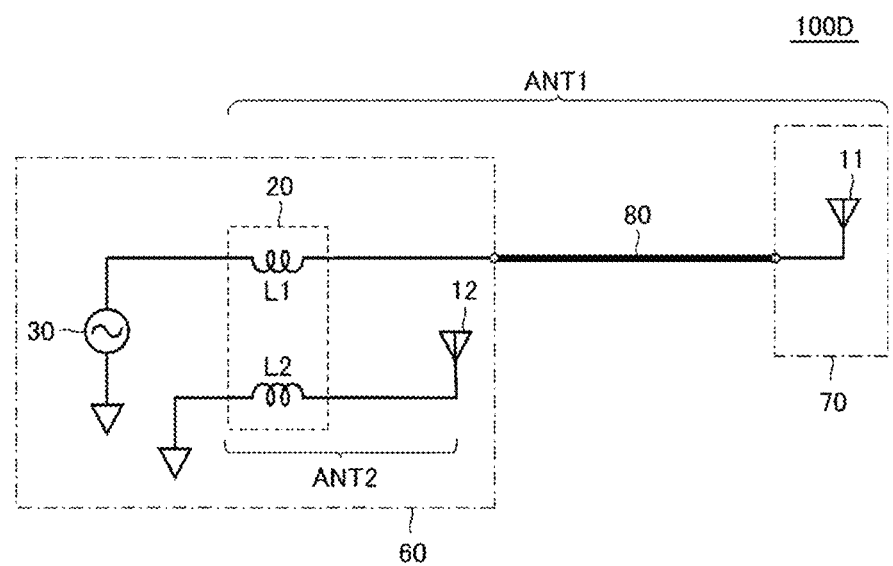
FIG. 18 is a circuit diagram of an antenna device according to Modification 4 of an example embodiment of the present invention.

FIG. 18 is a circuit diagram of an antenna device 100D according to Modification 4 of an example embodiment of the present invention. In the antenna device 100D illustrated in FIG. 18, components that are the same or substantially the same as those in the antenna device 100 illustrated in FIG. 1 are denoted by the same reference signs and a detailed description thereof is not repeated.

In the antenna device 100D, the first radiating element 11 and the second radiating element 12 are not provided in or on the same substrate. The first radiating element 11 is provided in or on a sub-substrate 70 different from a main substrate 60 where the second radiating element 12 is provided. In or on the main substrate 60, the feed circuit 30 connected to the first radiating element 11, the first coil L1 connected between the first radiating element 11 and the feed circuit 30, the second coil L2 that magnetically couples to the first coil L1, and the second radiating element 12 connected to the second coil L2 are provided. The first coil L1 and the second coil L2 define the antenna coupling element 20.

The first radiating element 11 provided in or on the sub-substrate 70 and the first coil L1 provided in or on the main substrate 60 are connected with a coaxial cable 80. The first radiating element 11 is provided in or on the sub-substrate 70 and is connected to the main substrate 60 via the coaxial cable 80, thus increasing flexibility in the disposition of the first radiating element 11. On the other hand, the second radiating element 12, which is a parasitic element, is provided in or on the main substrate 60, and thus the second radiating element 12 can radiate a radio wave from the second coil L2 without the radio wave passing through a long transmission line. Consequently, transmission loss can be reduced in the second radiating element 12.

A transmission line connecting the main substrate 60 and the sub-substrate 70 is not limited to the coaxial cable 80 and may be defined, for example, by a Printed Circuit Board (PCB), Flexible Printed Circuits (FPC), and a MetroCirc (registered trademark). The MetroCirc (registered trademark) is a resin multilayer substrate including, for example, a plurality of Liquid Crystal Polymer (LCP) sheets that are laminated.

As described above, in the antenna device 100D according to Modification 4, the first radiating element 11 and the first coil L1 are connected with the coaxial cable 80, and the first radiating element 11 can be provided in or on the sub-substrate 70. The main substrate 60 and the sub-substrate 70 are examples, and a substrate where the first radiating element 11 is provided only has to differ from a substrate where the second radiating element 12 is provided.

Modification 5

Figure 19:
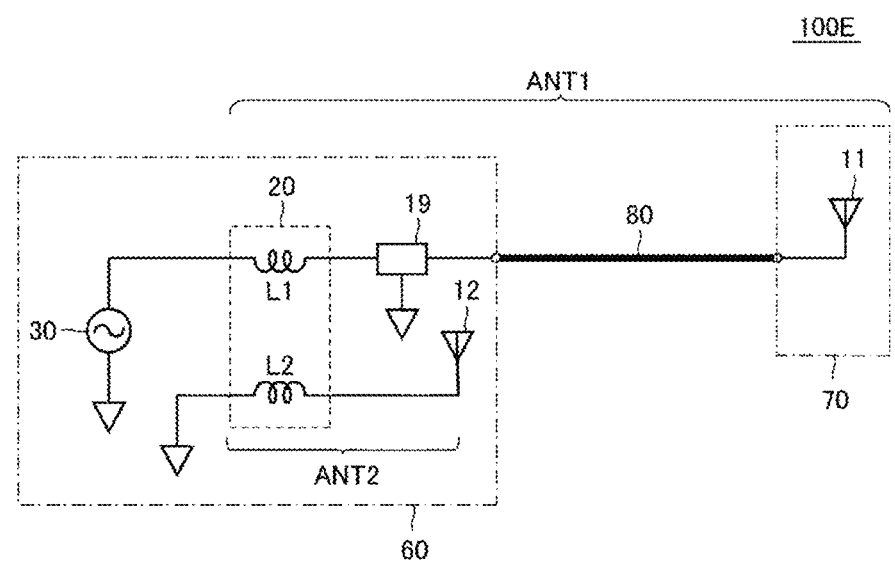
FIG. 19 is a circuit diagram of an antenna device according to Modification 5 of an example embodiment of the present invention.

FIG. 19 is a circuit diagram of an antenna device 100E according to Modification 5 of an example embodiment of the present invention. In the antenna device 100E illustrated in FIG. 19, components that are the same or substantially the same as those in the antenna device 100 illustrated in FIG. 1 and the antenna device 100D illustrated in FIG. 18 are denoted by the same reference signs and a detailed description thereof is not repeated.

In the antenna device 100E, an impedance matching element 19 is connected between the first coil L1 and a point to which the coaxial cable 80 is connected. When the impedance matching element 19 (third impedance matching element) is provided between the first coil L1 and the point to which the coaxial cable 80 is connected, impedance matching between a circuit including the main substrate 60 and the coaxial cable 80 can be provided, enabling a reduction in transmission loss in the coaxial cable 80, which is a long transmission line.

OTHER MODIFICATIONS

The antenna device 100 according to an example embodiment has been described above in which the first antenna ANT1 is caused to resonate at a resonant frequency of its fundamental and the second antenna ANT2 is caused to resonate at a resonant frequency of its third harmonic. However, the antenna device 100 is not limited to this. In the antenna device 100, the first antenna ANT1 may be caused to resonate at a resonant frequency of its third harmonic, and the second antenna ANT2 may be caused to resonate at a resonant frequency of its third harmonic. In a case where the first antenna ANT1 is caused to resonate at a resonant frequency of its third harmonic, the first antenna ANT1 may also be caused to resonate at a resonant frequency of its fundamental. Thus, in the antenna device 100, a frequency band including the resonant frequency of the fundamental of the first antenna ANT1 can also be used.

The antenna device 100 according to an example embodiment has been described above in which the second antenna ANT2 is caused to resonate at a resonant frequency of its third harmonic. However, the antenna device 100 is not limited to this. In the antenna device 100, the second antenna ANT2 may be caused to resonate at a resonant frequency of a wave other than the third harmonic. The length of a radiating element increases as a resonant frequency decreases. For this reason, if the second antenna ANT2 is caused to resonate at a resonant frequency of a harmonic higher than the third harmonic, a resonant frequency of its fundamental further decreases, and thus the length of the second radiating element 12 can be further increased.

In the antenna device 100 according to an example embodiment described above, while the first antenna ANT1 is excited in the band including n78, the second antenna ANT2 is excited in the band including n79 of higher frequencies. However, the antenna device 100 is not limited to this. In the antenna device 100, while the first antenna ANT1 is excited in the band including n78, the second antenna ANT2 may be excited in a band of lower frequencies. Furthermore, the antenna coupling element 20 may have additive polarity or subtractive polarity.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
   a first antenna; and
   a second antenna; wherein
   the first antenna includes:
      a first radiating element connected to a feed circuit to supply a radio-frequency signal; and
      a first coil connected between the first radiating element and the feed circuit; and
   the second antenna includes:
      a second coil magnetically coupled to the first coil; and
      a second radiating element connected to the second coil; and
   an impedance of the first antenna is higher than about 50Ω at a resonant frequency of a fundamental of the second antenna.

2. The antenna device according to claim 1, wherein a resonant frequency of a fundamental of the first antenna is lower than a resonant frequency of a harmonic of the second antenna.

3. The antenna device according to claim 2, wherein a length of the second radiating element is longer than a length of the first radiating element.

4. The antenna device according to claim 1, further comprising a first impedance matching element connected between the first coil and the feed circuit.

5. The antenna device according to claim 1, further comprising a second impedance matching element connected between the second coil and the second radiating element.

6. The antenna device according to claim 1, further comprising a capacitor connected in parallel with the first coil.

7. The antenna device according to claim 1, wherein the first radiating element and the second radiating element are provided on a same substrate.

8. The antenna device according to claim 1, wherein the second radiating element and the feed circuit are provided on a first substrate, and the first radiating element is provided on a second substrate.

9. The antenna device according to claim 8, wherein
the feed circuit and the first radiating element are connected with a cable; and
the antenna device further includes a third impedance matching element on the first substrate to which the cable is connected.

10. A communication terminal device comprising:
the feed circuit; and
the antenna device according to claim 1.

11. The communication terminal device according to claim 10, wherein a resonant frequency of a fundamental of the first antenna is lower than a resonant frequency of a harmonic of the second antenna.

12. The communication terminal device according to claim 11, wherein a length of the second radiating element is longer than a length of the first radiating element.

13. The communication terminal device according to claim 10, further comprising a first impedance matching element connected between the first coil and the feed circuit.

14. The communication terminal device according to claim 10, further comprising a second impedance matching element connected between the second coil and the second radiating element.

15. The communication terminal device according to claim 10, further comprising a capacitor connected in parallel with the first coil.

16. The communication terminal device according to claim 10, wherein the first radiating element and the second radiating element are provided on a same substrate.

17. The communication terminal device according to claim 10, wherein the second radiating element and the feed circuit are provided on a first substrate, and the first radiating element is provided on a second substrate.

18. The communication terminal device according to claim 17, wherein
the feed circuit and the first radiating element are connected with a cable; and
the antenna device further includes a third impedance matching element on the first substrate to which the cable is connected.

19. An antenna device comprising:
a first antenna; and
a second antenna; wherein
the first antenna includes:
a first radiating element connected to a feed circuit to supply a radio-frequency signal; and
a first coil connected between the first radiating element and the feed circuit;
the second antenna includes:
a second coil magnetically coupled to the first coil; and
a second radiating element connected to the second coil; and
a phase of a refection coefficient of the first antenna viewed from the feed circuit is equal or less than about 90 degrees, or equal or larger than about 270 degrees at a resonance frequency of a fundamental of the second antenna.

20. The antenna device according to claim 1, wherein a resonant frequency of a fundamental of the first antenna is lower than a resonant frequency of a harmonic of the second antenna.

* * * * *